United States Patent
Ushikura et al.

(10) Patent No.: US 8,884,313 B2
(45) Date of Patent: Nov. 11, 2014

(54) TRANSISTOR, METHOD OF MANUFACTURING TRANSISTOR, DISPLAY UNIT, AND ELECTRONIC APPARATUS

(71) Applicant: Sony Corporation, Tokyo (JP)

(72) Inventors: Shinichi Ushikura, Kanagawa (JP); Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/678,591

(22) Filed: Nov. 16, 2012

(65) Prior Publication Data

US 2013/0134453 A1 May 30, 2013

(30) Foreign Application Priority Data

Nov. 25, 2011 (JP) .................. 2011-257437

(51) Int. Cl.
| | | |
|---|---|---|
| H01L 29/18 | (2006.01) | |
| H01L 33/00 | (2010.01) | |
| H01L 51/00 | (2006.01) | |
| H01L 29/66 | (2006.01) | |
| H01L 33/08 | (2010.01) | |
| H01L 51/10 | (2006.01) | |
| H01L 29/786 | (2006.01) | |
| H01L 51/05 | (2006.01) | |

(52) U.S. Cl.
CPC .............. *H01L 33/08* (2013.01); *H01L 29/7869* (2013.01); *H01L 51/0023* (2013.01); *H01L 29/786* (2013.01); *H01L 51/0545* (2013.01); *H01L 29/66477* (2013.01); *H01L 51/0018* (2013.01); *H01L 51/102* (2013.01)
USPC ........................................................ 257/88

(58) Field of Classification Search
CPC ............ H01L 27/1214; H01L 29/4908; H01L 29/7841; H01L 29/786; H01L 29/42384; H01L 51/0558; H01L 21/3262; H01L 27/092; H01L 31/0264; H01L 33/26; H01L 51/50; G09G 3/36
USPC ................. 257/291, 292, 439, 433, 223, 227, 257/E27.1, E27.125, E27.112, E27.117, 257/E29.145, 88, E29.147, E29.151, 257/E29.182, E29.202, E29.314, E29.32, 257/E23.016, 40; 25/291
See application file for complete search history.

(56) References Cited

U.S. PATENT DOCUMENTS

| | | | | |
|---|---|---|---|---|
| 6,653,176 | B2 * | 11/2003 | Kim et al. ........................ | 438/149 |
| 2007/0036887 | A1 * | 2/2007 | Haase et al. ..................... | 427/64 |
| 2008/0105873 | A1 * | 5/2008 | Wang et al. ..................... | 257/59 |
| 2010/0136755 | A1 * | 6/2010 | Gi Jun et al. ................... | 438/158 |
| 2010/0219402 | A1 * | 9/2010 | Katsuhara et al. .............. | 257/40 |

OTHER PUBLICATIONS

Chu, et al.; "High-performance organic thin-film transistor's with metal oxide/metal bilayer electrode"; Applied Physics Letters (2005); 87: 193508-1-193508-3.

Kuo and Jackson; "Direct lithographic top contacts for pentacene organic thin-film transistors"; Applied Physics Letters (2009); 94: 053304-1053304-3.

* cited by examiner

*Primary Examiner* — Dao H Nguyen
*Assistant Examiner* — Tram H Nguyen
(74) *Attorney, Agent, or Firm* — Wolf, Greenfield & Sacks, P.C.

(57) ABSTRACT

A transistor includes: a gate electrode; a semiconductor layer facing the gate electrode, with an insulating layer interposed in between; an etching stopper layer on the semiconductor layer; a pair of contact layers provided on the semiconductor layer, at least on both sides of the etching stopper layer; and source-drain electrodes electrically connected to the semiconductor layer through the pair of contact layers, and being in contact with the insulating layer.

12 Claims, 13 Drawing Sheets

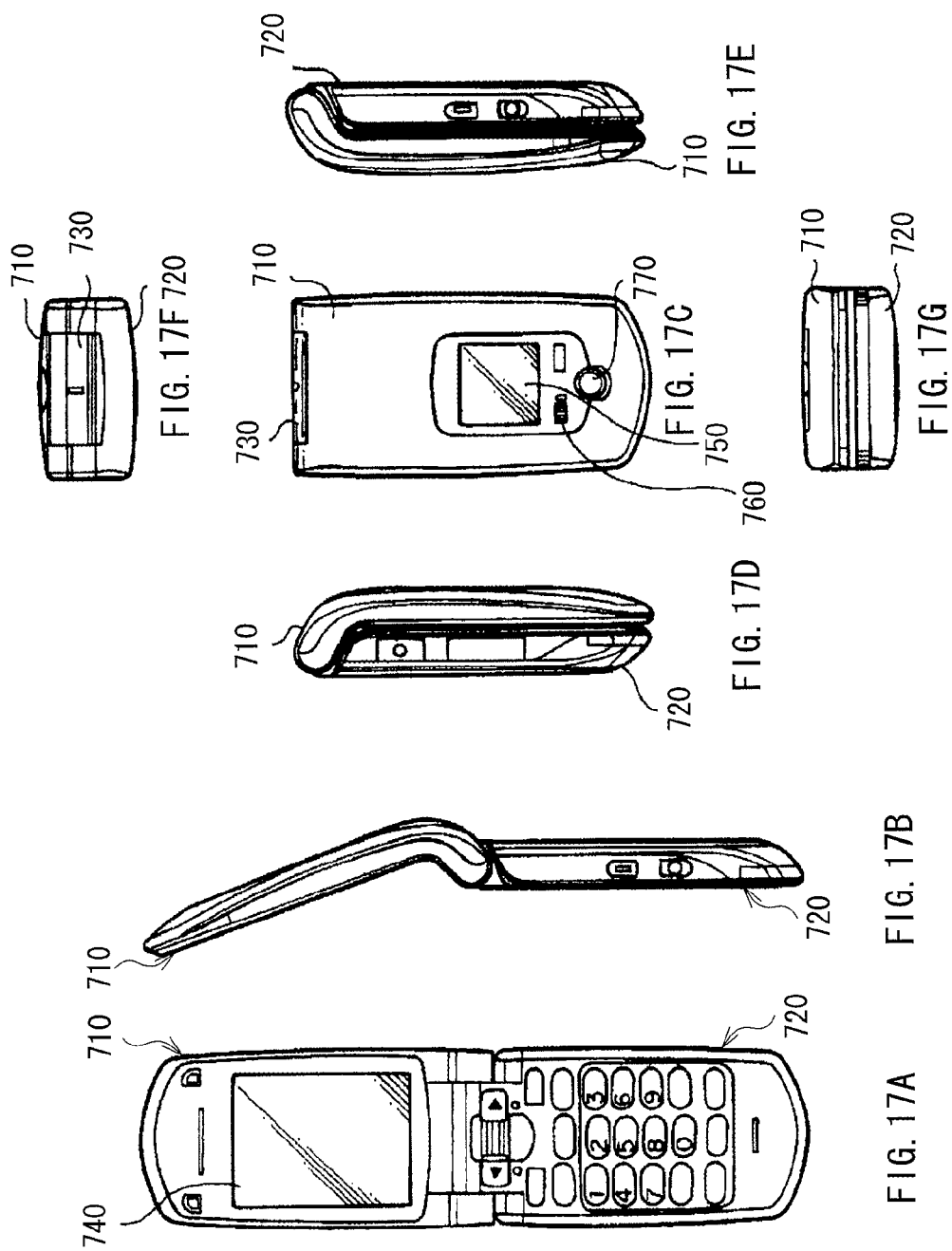

TRANSISTOR, METHOD OF MANUFACTURING TRANSISTOR, DISPLAY UNIT, AND ELECTRONIC APPARATUS

CROSS REFERENCE TO RELATED APPLICATION

This application claims the priority benefit of Japan Patent Application JP 2011-257437 filed in the Japan Patent Office on Nov. 25, 2011, the entire content of which is hereby incorporated by reference.

BACKGROUND

The technology relates to a transistor, a method of manufacturing the transistor, a display unit, and an electronic apparatus, which are suitable for application in which an organic semiconductor material is used for a semiconductor layer.

A Thin-Film Transistor (TFT) is used as a drive device in many electronic apparatuses such as display units. In the TFT, a gate electrode, a gate insulating layer, a semiconductor layer, and source-drain electrodes are provided on a substrate. For the semiconductor layer of such TFT, an inorganic material or an organic material is used. Expectations are placed on the semiconductor layer made of the organic material (i.e. an organic semiconductor layer) in terms of cost and flexibility, and the development thereof has been pursued (for example, see APPLIED PHYSICS LETTERS 2005, 87, 193508, and APPLIED PHYSICS LETTERS 2009, 94, 055304).

SUMMARY

The TFT using the organic semiconductor layer is expected to be manufactured more efficiently, through a reduction in manufacturing defects.

It is desirable to provide a transistor capable of being manufactured at high yield, a method of manufacturing the transistor, and a display unit as well as an electronic apparatus each having the transistor.

According to an embodiment of the technology, there is provided a transistor including: a gate electrode; a semiconductor layer facing the gate electrode, with an insulating layer interposed in between; an etching stopper layer on the semiconductor layer; a pair of contact layers provided on the semiconductor layer, at least on both sides of the etching stopper layer; and source-drain electrodes electrically connected to the semiconductor layer through the pair of contact layers, and being in contact with the insulating layer.

According to an embodiment of the technology, there is provided a display unit with pixels and at least one transistor that drives the pixels. The at least one transistor including: a gate electrode; a semiconductor layer facing the gate electrode, with an insulating layer interposed in between; an etching stopper layer on the semiconductor layer; a pair of contact layers provided on the semiconductor layer, at least on both sides of the etching stopper layer; and source-drain electrodes electrically connected to the semiconductor layer through the pair of contact layers, and being in contact with the insulating layer.

According to an embodiment of the technology, there is provided an electronic apparatus with a display unit, the display unit being provided with pixels and at least one transistor that drives the pixels. The at least one transistor including: a gate electrode; a semiconductor layer facing the gate electrode, with an insulating layer interposed in between; an etching stopper layer on the semiconductor layer; a pair of contact layers provided on the semiconductor layer, at least on both sides of the etching stopper layer; and source-drain electrodes electrically connected to the semiconductor layer through the pair of contact layers, and being in contact with the insulating layer.

According to an embodiment of the technology, there is provided a method of manufacturing a transistor, the method including: forming a gate electrode; forming a semiconductor layer that faces the gate electrode, with an insulating layer interposed in between; forming an etching stopper layer on the semiconductor layer; forming a pair of contact layers on the semiconductor layer, at least on both sides of the etching stopper layer; and forming source-drain electrodes in a region from the pair of contact layers to the insulating layer on the pair of contact layers and on the insulating layer.

In the transistor according to the above-described embodiment of the technology, the contact layers are provided on the semiconductor layer. Therefore, the contact layers are not present in a region around the semiconductor layer, and the insulating layer and the source-drain electrodes directly in contact with each other in this region.

According to the transistor, the method of manufacturing the same, the display unit, and the electronic apparatus of the above-described embodiments of the technology, the contact layers are provided on the semiconductor layer, and the source-drain electrodes are directly in contact with the insulating layer. Therefore, layer peeling due to the contact layers in the region around the semiconductor layer is allowed to be prevented. Hence, suppression of manufacturing defects and high manufacturing yield are achievable.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 14A illustrates the appearance when viewed from front, and FIG. 14B illustrates the appearance when viewed from back.

FIGS. 17A to 17G are views of an application example 7, namely, a front view in an open state, a side view in the open state, a front view in a closed state, a left-side view, a right-side view, a top view, and a bottom view, respectively.

DETAILED DESCRIPTION

An embodiment of the technology will be described below in detail with reference to the drawings. It is to be noted that the description will be provided in the following order.
1. Embodiment (an example in which each contact layer is not divided)
2. Modification (an example in which each contact layer is divided)
3. Application examples
[Embodiment]

Figure 1:
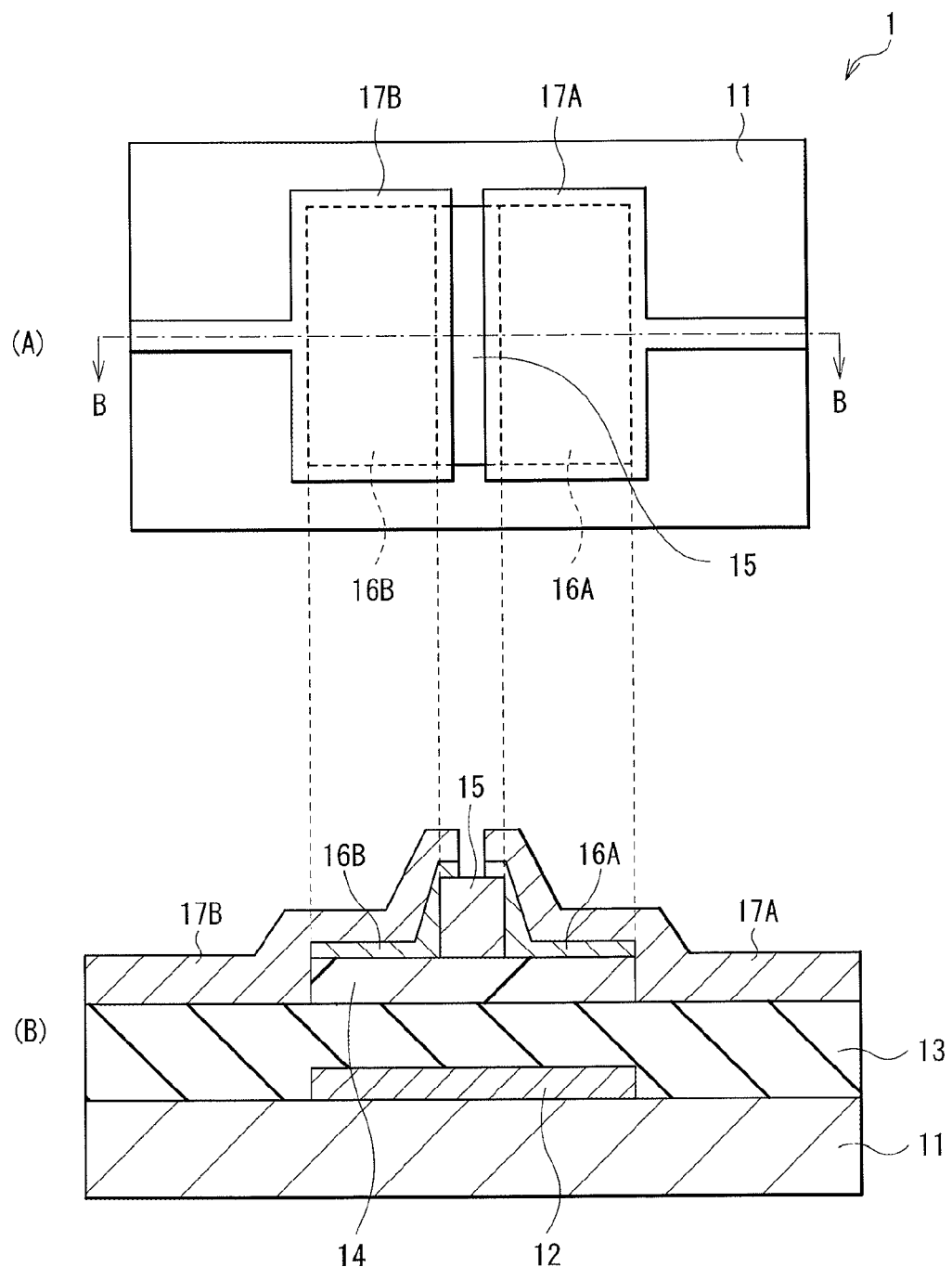
FIG. 1 illustrates a configuration of a transistor according to an embodiment of the disclosure.

Part (A) and Part (B) of FIG. 1 each illustrate a configuration of a transistor (a transistor 1) according to an embodiment of the disclosure. Part (A) of FIG. 1 illustrates a plane (top-surface) configuration of the transistor 1, and Part (B) of FIG. 1 illustrates a cross-sectional configuration taken along a line B-B in Part (A) of FIG. 1. The transistor 1 is a field effect transistor using an organic semiconductor material in a semiconductor layer, namely, an organic TFT. The transistor 1 is used as a drive device of a display using any of, for example but not limited to, a liquid crystal display body, an organic EL display body, and an electrophoretic display body. This transistor 1 has a so-called top-contact bottom-gate structure. The transistor 1 includes a gate electrode 12, a gate insulating layer 13 (an insulating layer), an organic semiconductor layer 14 (a semiconductor layer), an etching stopper layer 15, contact layers 16A and 16B, and source-drain electrodes 17A and 17B, in this order on a substrate 11.

The substrate 11 supports the gate electrode 12, etc. and a surface thereof (i.e. a surface on the gate electrode 12 side) has an insulation property. The substrate 11 is, for example, a plastic substrate made of a material such as PES (polyether sulfone), PEN (polyethylene naphthalate), PET (polyethylene terephthalate), PC (polycarbonate), and PI (polyimide). As the substrate 11, a laminate formed by applying a resin to a surface of a metal foil made of stainless steel (SUS) or the like may be used. Alternatively, a glass substrate may be used as the substrate 11. It is preferable to use a plastic substrate or a metal foil in order to achieve high flexibility.

The gate electrode 12 serves to apply a gate voltage to the transistor 1, and control a carrier density in the organic semiconductor layer 14 by using this gate voltage. The gate electrode 12 is provided in a selective region on the substrate 11. The gate electrode 12 is made of, for example, a simple metal such as gold (Au), aluminum (Al), silver (Ag), copper (Cu), platinum (Pt), and nickel (Ni), or an alloy of these metals. The gate electrode 12 may be a laminated body including an element such as titanium (Ti) and chromium (Cr). Such a laminated structure makes it possible to improve adhesion to the substrate 11 or a resist used in processing. Other inorganic conductive materials, organic conductive materials, and further, carbon materials may be used in the gate electrode 12.

The gate insulating layer 13 is provided between the gate electrode 12 and the organic semiconductor layer 14, so as to insulate the gate electrode 12 and the organic semiconductor layer 14 from each other. The organic semiconductor layer 14 is electrically connected to the source-drain electrodes 17A and 17B. The gate insulating layer 13 is configured using, for example, an organic insulating film made of a material such as PVP (polyvinyl phenol), PMMA (polymethyl methacrylate), PVA (polyvinyl alcohol), and PI. For the gate insulating layer 13, an inorganic insulating film made of a material such as silicon oxide ($SiO_2$), aluminum oxide ($Al_2O_3$), tantalum oxide ($Ta_2O_5$), and silicon nitride (SiNx) may be used.

The organic semiconductor layer 14 is shaped like an island, and provided on the gate insulating layer 13, to face the gate electrode 12. The organic semiconductor layer 14 forms a channel, through the application of a gate voltage. The organic semiconductor layer 14 may be made of either a p-type organic semiconductor material or an n-type organic semiconductor material. As the p-type organic semiconductor material, there may be used, for example, pentacene, anthracene, phthalocyanine, porphyrin, a thiophene-based polymer, or a derivative of any of these. As the n-type organic semiconductor material, there may be used, for example, fullerene, perfluoropentacene, poly benzobisimida-zobenzophenanthroline, or a derivative of any of these.

The etching stopper layer 15 is provided on a part (e.g., a central part) of the organic semiconductor layer 14, in order to protect the organic semiconductor layer 14 when a metal film (a metal film 17M in FIGS. 3A and 3B which will be described later) is patterned to form the source-drain electrodes 17A and 17B. In other words, a space between the source-drain electrode 17A and the source-drain electrode 17B is located on the etching stopper layer 15. Provision of this etching stopper layer 15 makes it possible to form the source-drain electrodes 17A and 17B through patterning using dry etching when the transistor 1 of a top contact type is integrated. The etching stopper layer 15 is made of a material having insulation and preventing deterioration of the organic semiconductor layer 14. Specifically, an inorganic insulating film made of a material such as SiNx and $SiO_2$, an organic resin insulating film, or a fluororesin insulating material film may be used.

The pair of contact layers 16A and 16B facing each other are each provided on the organic semiconductor layer 14 continuously from a top surface of the etching stopper layer 15 through an end face of the same. In other words, the contact layers 16A and 16b are provided on both sides (on a right side and a left side in Part (B) of FIG. 1) of the etching stopper layer 15. Specifically, the contact layer 16A is provided between the organic semiconductor layer 14 and the source-drain electrode 17A, and the contact layer 16B is provided between the organic semiconductor layer 14 and the source-drain electrode 17B. This suppresses contact resistance between each of the source-drain electrodes 17A and 17B and the organic semiconductor layer 14. It is to be noted that the contact layers 16A and 16B may be provided at least on the organic semiconductor layer 14, and the transistor 1 may be configured without providing the contact layers 16A and 16B on the etching stopper layer 15.

The contact layers 16A and 16B have respective surfaces facing each other which agree in position with respective surfaces facing each other of the source-drain electrodes 17A and 17B. Further, the contact layers 16A and 16B have respective end faces (surfaces opposite to the surfaces facing each other of the contact layers 16A and 16B) which agree in position with end faces of the organic semiconductor layer 14. As will be described later in detail, in the present embodiment, since the contact layers 16A and 16B are provided only on the organic semiconductor layer 14, wiring peeling which occurs around the organic semiconductor layer 14 is prevented to improve manufacturing yield.

The contact layers 16A and 16B are made of any of various kinds of materials, which is selected to be suitable for a factor such as a conductivity type and a HOMO level of the organic semiconductor layer 14. Examples of these materials include oxides, halides, sulfides, carbonates, organic molecules as well as complexes, and conductive polymers. When the organic semiconductor layer 14 is made of, for example, the p-type organic semiconductor material, any of the following materials may be used for the contact layers 16A and 16B without limitation. The materials that may be used for the contact layers 16A and 16B include, for example: metal oxides such as $MoO_3$, $ReO_3$, $V_2O_5$, $WO_3$, $TiO_2$, $AuO$, $Al_2O_3$, and $CuO$; oxides such as $SO_3$; metal halides such as $CuI$, $SbCl_5$, $SbF_5$, $FeCl_3$, $LiF$, $BaF_2$, $CaF_2$, and $MgF_2$; metal sulfides such as $Cu_2S$; halides such as $AsF_5$, $BF_3$, $BCl_3$, $BBr_3$, and $PF_5$; and metal carbonates such as $CaCO_3$, $BaCO_3$, and $LiCO_3$. There may also be used, for example, p-benzoquinones such as 2,3,5,6-tetracyano-(p-cyanyl), 2,3-dibromo-5,6-dicyano-p-benzoquinone, 2,3-dichloro-5,6-dicyano-p-benzoquinone, 2,3-diiodo-5,6-dicyano-p-benzoquinone, 2,3-dicyano-p-benzoquinone, p-bromanil, p-chloranil, p-iodanil, p-fluoranil, 2,5-dichloro-p-benzoquinone, 2,6-dichloro-p-benzoquinone, chloranilic acid, bromanil acid, 2,5-dihydrixy-p-benzoquinone, 2,5-dichloro-3,6-dimethyl-p-benzoquinone, 2,5-dibromo-3,6-dimethyl-p-benzoquinone, BTDAQ, p-benzoquinone, 2,5-dimethyl-p-benzoquinone, 2,6-dimethyl-p-benzoquinone, durol (1,2,4,5-tetramethylbenzen), o-benzoquinones, o-bromanil, o-chloranil, 1,4-naphthoquinones, 2,3-dicyano-5-nitro-1,4-naphthoquinone, 2,3-dicyano-1,4-naphthoquinone, 2,3-dichloro-5-nitro-1,4-naphthoquinone, 2,3-dichloro-1,4-naphthoquinone, and 1,4-naphthoquinone. There may also be used, for example, diphenoquinones such as 3,3'5,5'-tetrabromo-diphenoquinone, 3,3'5,5'-tetrachloro-diphenoquinone, and diphenoquinone. Further, for example, TCNQs and analogs of the TCNQs may also be used. Examples of TCNQs include tetracyano-quinodimethane (TCNQ), Tetrafluoro-tetracyano-quinodimethane (F4-TCNQ), trifluoromethyl-TCNQ, 2,5-difluoro-TCNQ, monofluoro-TCNQ, TNAP, decyl-TCNQ, methyl-TCNQ, dihydrobarreleno-TCNQ, tetrahydrobarreleno-TCNQ, dimethyl-TCNQ, diethyl-TCNQ, benzo-TCNQ, dimethoxy-TCNQ, BTDA-TCNQ, diethoxy-TCNQ, tetramethyl-TCNQ, tetracyanoanthraquinodimethane, polynitro compound, tetranitrobiphenol, dinitrobiphenyl, picric acid, trinitrobenzene, 2,6-dinitrophenol, and 2,4-dinitrophenol. There may also be used, for example, fluorenones such as 9-dicyanomethylene-2,4,5,7-tetranitro-fluorene, 9-dicyanomethylene-2,4,7-trinitro-fluorene, 2,4,5,7-tetranitro-fluorenone, and 2,4,7-trinitro-fluorenone. Further, for example, benzocyanos and analogs of the benzocyanos may also be used. Examples of the benzocyanos include (TBA) 2HCTMM, (TBA)2HCDAHD, K·CF, TBA·PCA, TBA·MeOTCA, TBA·EtOTCA, TBA·PrOTCA, (TBA) 2HCP, hexacyanobutadiene tetracyanoethylene, and 1,2,4,5-tetracyanobenzene. There may also be used, for example, transition metal complexes such as $(TPP)_2Pd(dto)_2$, $(TPP)_2Pt(dto)_2$, $(TPP)_2Ni(dto)_2$, $(TPP)_2Cu(dto)_2$, and $(TBA)_2Cu(ox)_2$, and further, conductive polymers such as PEDOT/PSS and polyaniline.

When the organic semiconductor layer 14 is made of the n-type organic semiconductor material, for example, any of the following materials may be used for the contact layers 16A and 16B without limitation. The materials that may be used for the contact layers 16A and 16B include, for example: metals such as Li and Cs; metal carboxylates such as $Cs_2CO_3$ and $Rb_2CO_3$; and aromatic hydrocarbons such as tetracene, perylene, anthracene, coronene, pentacene, chrysene, phenanthrene, naphthalene, p-dimethoxybenzene, rubrene, and hexamethoxy triphenylene, as well as analogs of the aromatic hydrocarbons. Further, for example, TTFs and analogs of the TTFs may also be used. Examples of the TTFs include HMTTF, OMTTF, TMTTF, BEDO-TTF, TTeCn-TTF, TMTSF, EDO-TTF, HMTSF, TTF, EOET-TTF, EDT-TTF, (EDO)2DBTTF, TSCn-TTF, HMTTeF, BEDT-TTF, CnTET-TTF, TTCn-TTF, TSF, and DBTTF. There may also be used, for example, TTTs such as tetrathiotetracene, tetraselenotetracene, and tetratellurotetracene. There may also be used, for example, azines such as dibenzo[c,d]-phenothiazine, benzo[c]-phenothiazine, phenothiazine, N-methyl-phenothiazine, dibenzo[c,d]-phenoselenazine, N,N-dimethylphenazine, and phenazine. There may also be used, for example, monoamines such as N,N-diethyl-m-toluidine, N,N-diethylaniline, N-ethyl-o-toluidine, diphenylamine, skatole, indole, N,N-dimethyl-o-toluidine, o-toluidine, m-toluidine, aniline, o-chloroaniline, o-bromoaniline, and p-nitroaniline. There may also be used, for example, diamines such as N,N,N',N'-tetramethyl-p-phenylenediamine, 2,3,5,6-tetramethyl-(durenediamine), p-phenyl diamine, N,N,N',N'-tetramethylbenzidine, 3,3',5,5'-tetramethylbenzidine, 3,3'-dimethylbenzidine, 3,3'-dimethoxybenzidine, benzidine, 3,3'-dibromo-5,5'-dimethylbenzidine, 3,3'-dichloro-5,5'-dimethylbenzidine, and 1,6-diaminopyrene. Besides, there may be used, for example, 4',4"-tris(N-3-methylphenyl-N-phenylamino)-triphenylamine:(m-MTDATA), 4,4',4"-tris(N-(2-Naphtyl)-N-phenylamino)-triphenylamine:(2TNATA), α-NDP, copper phthalocyanine, 1,4,6,8-tetrakis(dimethylamino)pyrene, 1,6-dithiopyrene, decamethylferrocene, and ferrocene.

Each of the contact layers 16A and 16B made of any of the above-described materials has a thickness of about a few nanometers to about 30 nm. Providing the contact layers 16A and 16B as thin layers in this way makes it possible to suppress resistance in a vertical direction (a thickness direction).

The source-drain electrodes 17A and 17B are electrically connected to the organic semiconductor layer 14 through the contact layers 16A and 16B, respectively. The source-drain electrodes 17A and 17B cover the end faces of the respective contact layers 16A and 16B, as well as the end faces of the organic semiconductor layer 14. Thus, in a manufacturing process in or after formation of the source-drain electrodes 17A and 17B, the end faces of the respective contact layers 16A and 16B are protected.

The source-drain electrodes 17A and 17B are made of, for example, a simple metal such as gold, aluminum, silver, copper, platinum, nickel, and ITO (Indium Tin Oxide), or an alloy of any of these metals. An element such as titanium and chromium may be laminated on or below the source-drain electrodes 17A and 17B, in a manner similar to the gate electrode 12. Such a laminated structure allows an improvement in adhesion to the substrate 11, the resist used in processing, or the contact layers 16A and 16B. The source-drain electrodes 17A and 17B may be formed by patterning conductive ink that contains electrically-conductive fine particles.

The transistor 1 may be manufactured as follows, for example.

Figure 2A:
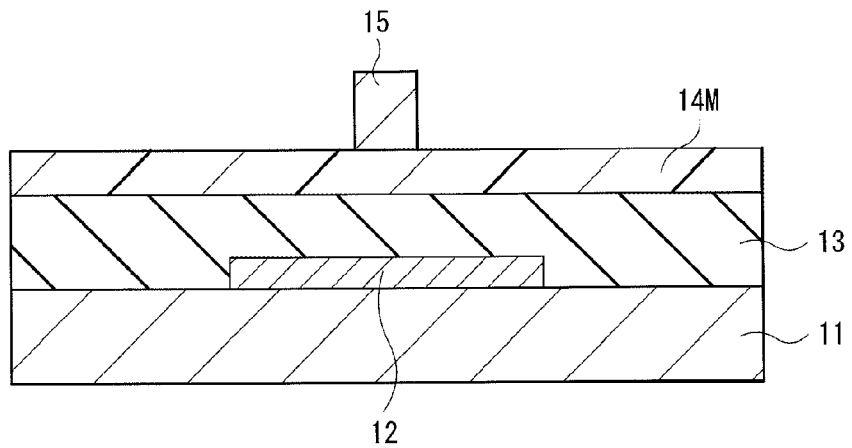
FIGS. 2A and 2B are cross-sectional diagrams illustrating a method of manufacturing the transistor illustrated in FIG. 1, in a process order.

First, the gate electrode 12, the gate insulating layer 13, an organic film 14M which will become the organic semiconductor layer 14, and the etching stopper layer 15 are formed in this order on the substrate 11, as illustrated in FIG. 2A. Specifically, first, a conductive film which will be the gate electrode 12 is formed on the entire surface of the substrate 11 by, for example, vapor deposition, sputtering, or the like. Subsequently, pattern formation of a photoresist on this conductive film is performed by photolithography, for example. The conductive film is then patterned by etching using the photoresist after the pattern formation as a mask. The gate electrode 12 is thus formed. Alternatively, the gate electrode 12 may be formed by a printing method such as screen printing, gravure printing, and ink jet printing. Next, the gate insulating layer 13 made of an organic insulating material is formed over the entire surface on the substrate 11, by using, for example, any of coating methods including spin coating and printing such as screen printing, gravure printing, and ink jet printing. When the gate insulating layer 13 is made of an inorganic insulating material, there may be used, for example, vapor deposition, sputtering, CVD (Chemical Vapor Deposition), or the like. After the gate insulating layer 13 is formed, the organic film 14M made of the material of the organic semiconductor layer 14 is formed over the entire surface of the substrate 11 (on the gate insulating layer 13), by, for example, vapor deposition or coating such as spin coating and slit coating. Next, the etching stopper layer 15 which has been patterned is directly formed on the organic film 14M, by pattern vapor deposition or printing using a mask, for example. The etching stopper layer 15 may be formed by forming a film made of the above-described material of the etching stopper layer 15 over the entire surface of the substrate 11 (on the organic film 14M), and then patterning this film through use of photolithography, for example.

Figure 2B:
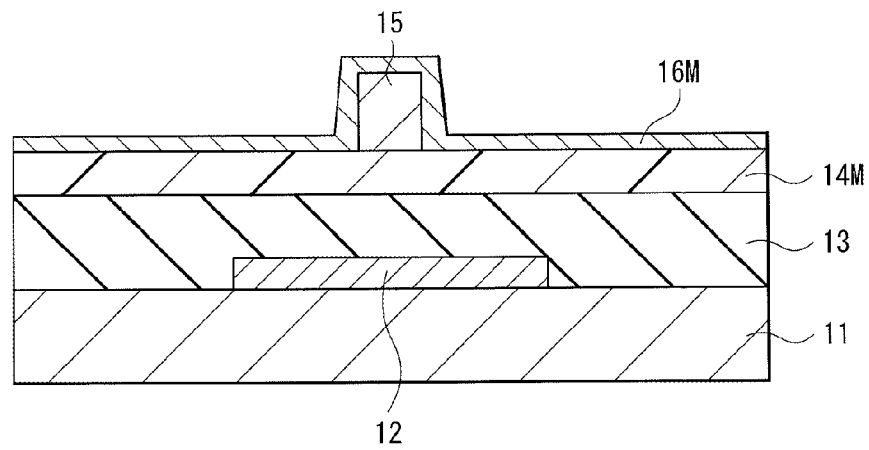

After the etching stopper layer 15 is formed, a contact material film 16M which will become the contact layers 16A and 16B is formed by, for example, vapor deposition, sputtering, CVD, or coating such as spin coating and slit coating, as illustrated in FIG. 2B.

Figure 3A:
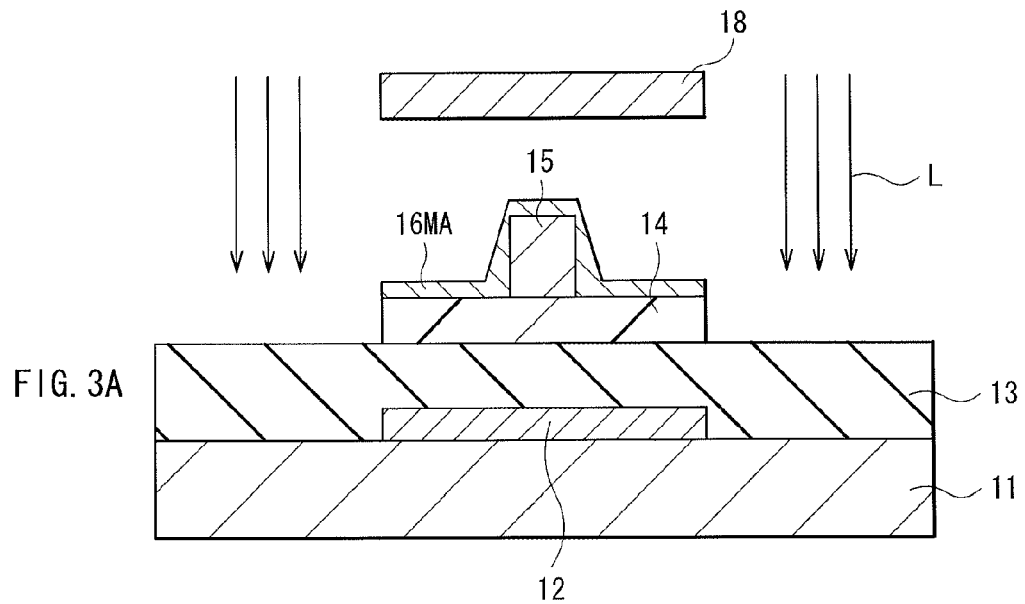
FIGS. 3A and 3B are cross-sectional diagrams illustrating processes following FIG. 2B.

Next, the organic film 14M and the contact material film 16M are patterned by laser ablation of emitting a laser beam L by using a mask 18 having a pattern shape of the organic semiconductor layer 14, as illustrated in FIG. 3A. The organic semiconductor layer 14 and a contact material film 16MA are formed by this process. Here, end faces of this contact material film 16MA agree in position with the end faces of the organic semiconductor layer 14 and thus, the contact layers 16A and 16B are provided only on the organic semiconductor layer 14. This patterning of the organic film 14M and the contact material film 16M may be performed by a method different from the laser ablation, but the use of the laser ablation is preferable because no residue etc. of the mask is produced.

Figure 3B:
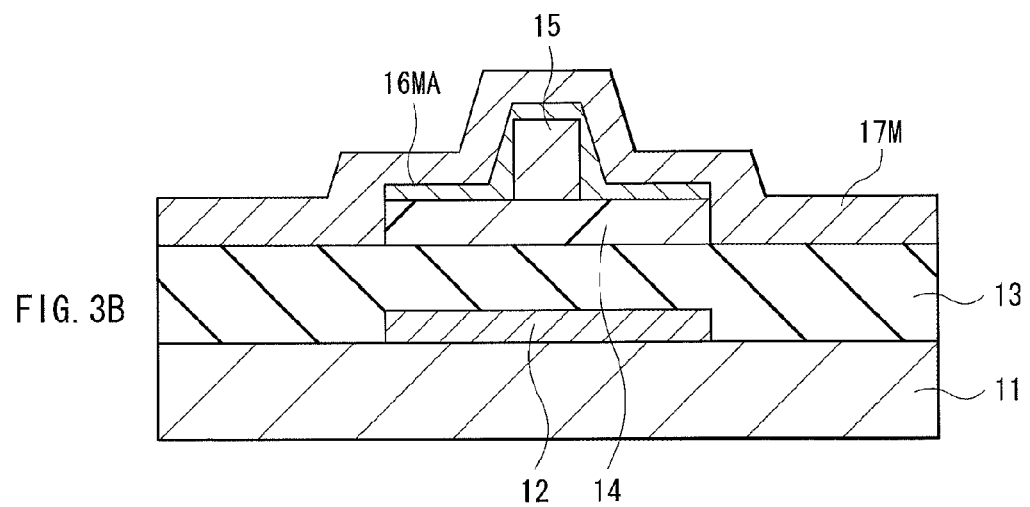

Next, the metal film 17M which will become the source-drain electrodes 17A and 17B are formed on the contact material film 16MA and the gate insulating layer 13, as illustrated in FIG. 3B. At this moment, the end faces of the contact material film 16MA agree in position with the end faces of the organic semiconductor layer 14 and therefore, the end faces of the contact material film 16MA and the end faces of the organic semiconductor layer 14 are both covered by the metal film 17M. After being formed, the metal film 17M is patterned to form the source-drain electrodes 17A and 17B. Since the etching stopper layer 15 is provided, dry etching may be used for this patterning of the metal film 17M. In addition, since the end faces of the contact material film 16MA (the contact layers 16A and 16B) are covered with the metal film 17M (the source-drain electrodes 17A and 17B), side etching of the contact material film 16MA in a process of the patterning of the metal film 17M is allowed to be prevented. Simultaneously with the patterning of the metal film 17M or after the formation of the source-drain electrodes 17A and 17B, the contact material film 16MA is etched to form the contact layers 16A and 16B. The transistor 1 is completed by going through the above-described processes.

Figure 4:
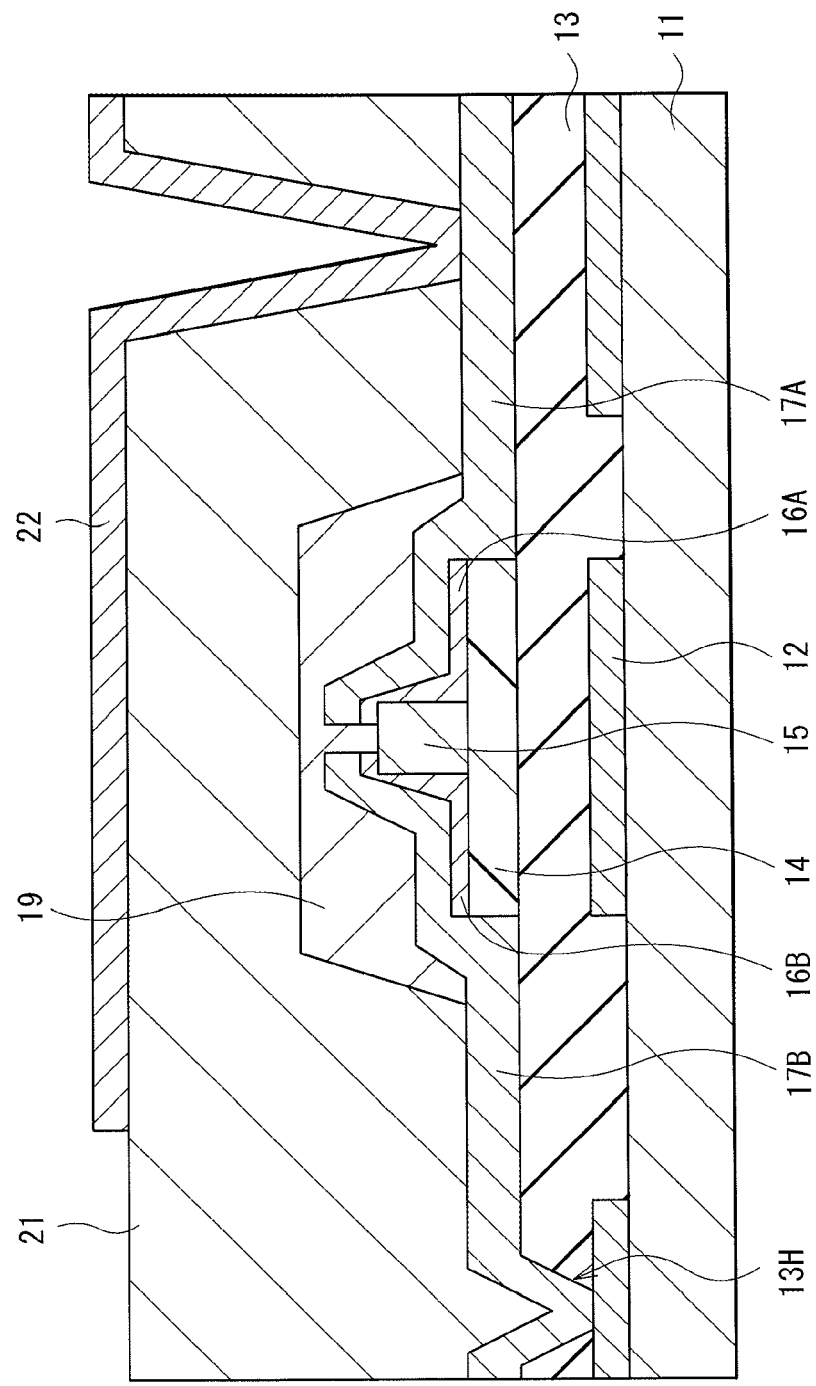
FIG. 4 is a cross-sectional diagram illustrating an example of a process following FIG. 3B.

When the transistor 1 is integrated, a passivation layer 19, a flattening layer 21, wiring 22, and the like, are formed in this order on the source-drain electrodes 17A and 17B, after the formation of the source-drain electrodes 17A and 17B, as illustrated in FIG. 4, for example. The source-drain electrodes 17A and 17B may be connected to an electrode provided below the gate insulating layer 13 (e.g., an electrode provided in a same layer as the gate electrode 12), by forming a connection aperture 13H in the gate insulating layer 13.

In the present embodiment, the contact layers 16A and 16B are provided only on the organic semiconductor layer 14. Therefore, layer peeling in a region around the organic semiconductor layer 14, specifically, wiring peeling of the source-drain electrodes 17A and 17B, is prevented, which allows an improvement in yields. This will be described below using comparative examples 1 and 2.

Figure 5:
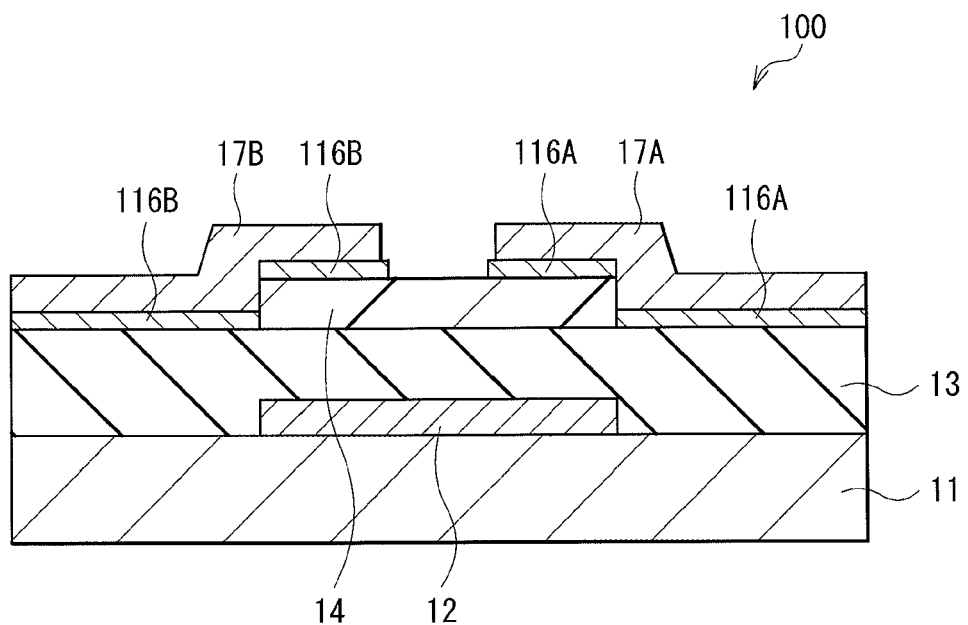
FIG. 5 is a cross-sectional diagram illustrating a configuration of a transistor according to a comparative example 1.

FIG. 5 illustrates a cross-sectional configuration of a transistor 100 according to the comparative example 1. The transistor 100 has a bottom-gate top-contact structure, like the transistor 1. In this transistor 100, however, contact layers 116A and 116B are provided not only on an organic semiconductor layer 14, but between a gate insulating layer 13 and source-drain electrodes 17A and 17B, around the organic semiconductor layer 14. In such transistor 100, adhesion between the gate insulating layer 13 and each of the contact layers 116A and 116B is low, and adhesion between each of the source-drain electrodes 17A and 17B and each of the contact layers 116A and 116B is also low. Thus, layer peeling is likely to occur between these elements, which will reduce manufacturing yield. In addition, when a connection aperture (similar to the connection aperture 13H in FIG. 4, for instance) is provided in the gate insulating layer 13 to connect the source-drain electrodes 17A and 17B to an electrode provided below the gate insulating layer 13, the contact layers 116A and 116B serve as a resistance component that inhibits this connection.

Figure 6:
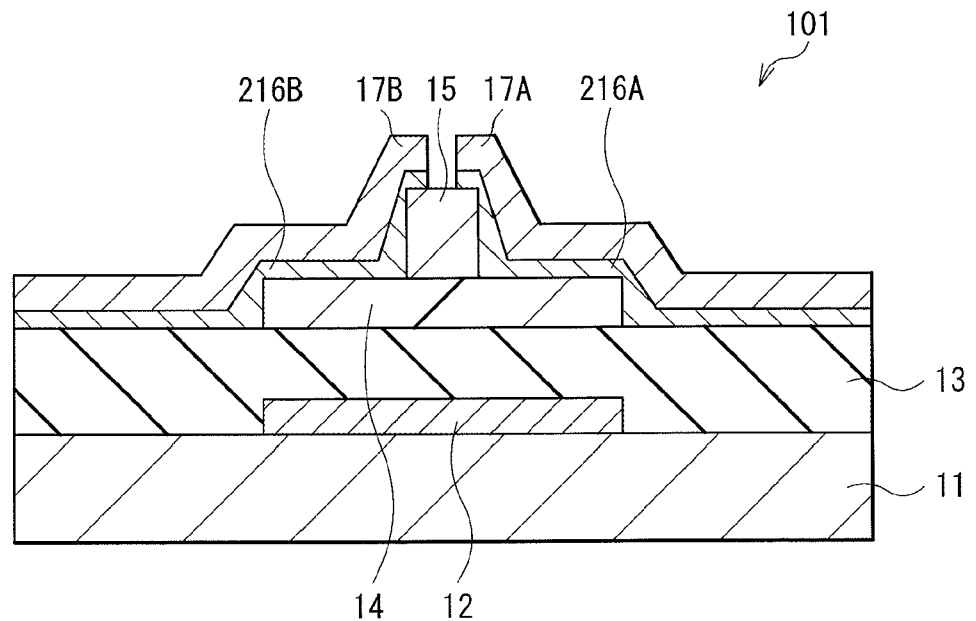
FIG. 6 is a cross-sectional diagram illustrating a configuration of a transistor according to a comparative example 2.

The transistor 100 is not provided with the etching stopper layer 15 and therefore, the source-drain electrodes 17A and 17B are not formed by dry etching at the time of integration. Meanwhile, a transistor 101 (FIG. 6) according to the comparative example 2 has an etching stopper layer 15. In this transistor 101, contact layers 216A and 216B are present around an organic semiconductor layer 14 in a manner similar to the transistor 100. Therefore, although layer peeling may occur, it is possible to use dry etching in forming source-drain electrodes 17A and 17B.

In this transistor 101, however, at the time of forming the source-drain electrodes 17A and 17B or in a process subsequent thereto, the contact layers 216A and 216B may be side-etched unintentionally, causing electrode detachment or poor contacting of the source-drain electrodes 17A and 17B. When a transistor of a top contact type is manufactured, for example, a water solution or water is often used in processing of wiring (an electrode) or washing of a resist film and the like, in order to prevent an organic semiconductor layer from deteriorating due to an organic solvent. However, many of materials (e.g., $MoO_3$, $WO_3$, $V_2O_5$, $FeCl_3$, PEDOT/PSS, and the like) of the contact layers are soluble in water. Meanwhile, the contact layers each have a small thickness in order to suppress electrical resistance. Therefore, for example, the contact layers are readily etched by an alkali water solution or water used in a resist detachment process at the time of manufacturing. For instance, $MoO_3$ which will be the material of the contact layer dissolves in pure water in about three seconds, even when the thickness thereof is about 50 nm.

As for the transistor 101, after the organic semiconductor layer 14 shaped like an island is formed, a material film of the contact layers 216A and 216B and a metal film which will become the source-drain electrodes 17A and 17B are formed continuously, and patterned at the same time. In other words, end faces of the respective contact layers 216A and 216B agree in position with end faces of the respective source-drain electrodes 17A and 17B, and the end faces of the respective contact layers 216A and 216B are exposed. For this reason, the contact layers 216A and 216B might be side-etched unintentionally by an alkali water solution or water used in forming the source-drain electrodes 17A and 17B or in a process subsequent thereto.

In contrast to these comparative examples 1 and 2, the contact layers 16A and 16B are provided only on the organic semiconductor layer 14 in the present embodiment. Therefore, it is possible to prevent the occurrence of layer peeling between each of the contact layers 16A and 16B and the gate insulating layer 13, or between each of the contact layers 16A and 16B and each of the source-drain electrodes 17A and 17B, in the region around the organic semiconductor layer 14. In other words, wiring peeling of the source-drain electrodes 17A and 17B is allowed to be prevented.

Further, when the connection aperture 13H is provided in the gate insulating layer 13 to connect the source-drain electrode 17B to an electrode that is in the same layer as the gate electrode 12, the contact layers 16A and 16B do not impair this connection.

Furthermore, since the end faces of the respective contact layers 16A and 16B are covered by the source-drain electrodes 17A and 17B, the contact layers 16A and 16B are protected from a water solution or water used in the formation of the source-drain electrodes 17A and 17B or in the formation of an upper layer such as the passivation layer 19 (FIG. 4). Therefore, prevention of electrode detachment, poor contacting, etc., due to side etching is enabled, which allows an improvement in transistor properties.

In the transistor 1 of the present embodiment, when a predetermined electric potential is supplied to the gate electrode 12, an electric field is generated in a channel of the organic semiconductor layer 14, and then a current flows between the source-drain electrodes 17A and 17B. In other words, the transistor 1 of the present embodiment functions as a so-called field-effect transistor. Here, the contact layers 16A and 16B are provided on the organic semiconductor layer 14 and thus, it is unlikely that layer peeling around the organic semiconductor layer 14 is generated.

In the present embodiment, since the contact layers 16A and 16B are provided on the organic semiconductor layer 14 as described above, layer peeling is prevented, which allows an improvement in manufacturing yield. In addition, when the connection aperture 13H is provided in the gate insulating layer 13, the contact layers 16A and 16B are allowed to maintain a good connection state, without impairing the connection.

Further, since the end faces of the respective contact layers 16 and 16B are covered with the source-drain electrodes 17A and 17B, the contact layers 16A and 16B are protected from a resist stripping solution and the like used in or after a process of forming the source-drain electrodes 17A and 17B. Thus, transistor characteristics are allowed to be improved.

[Modification]

Figure 7:
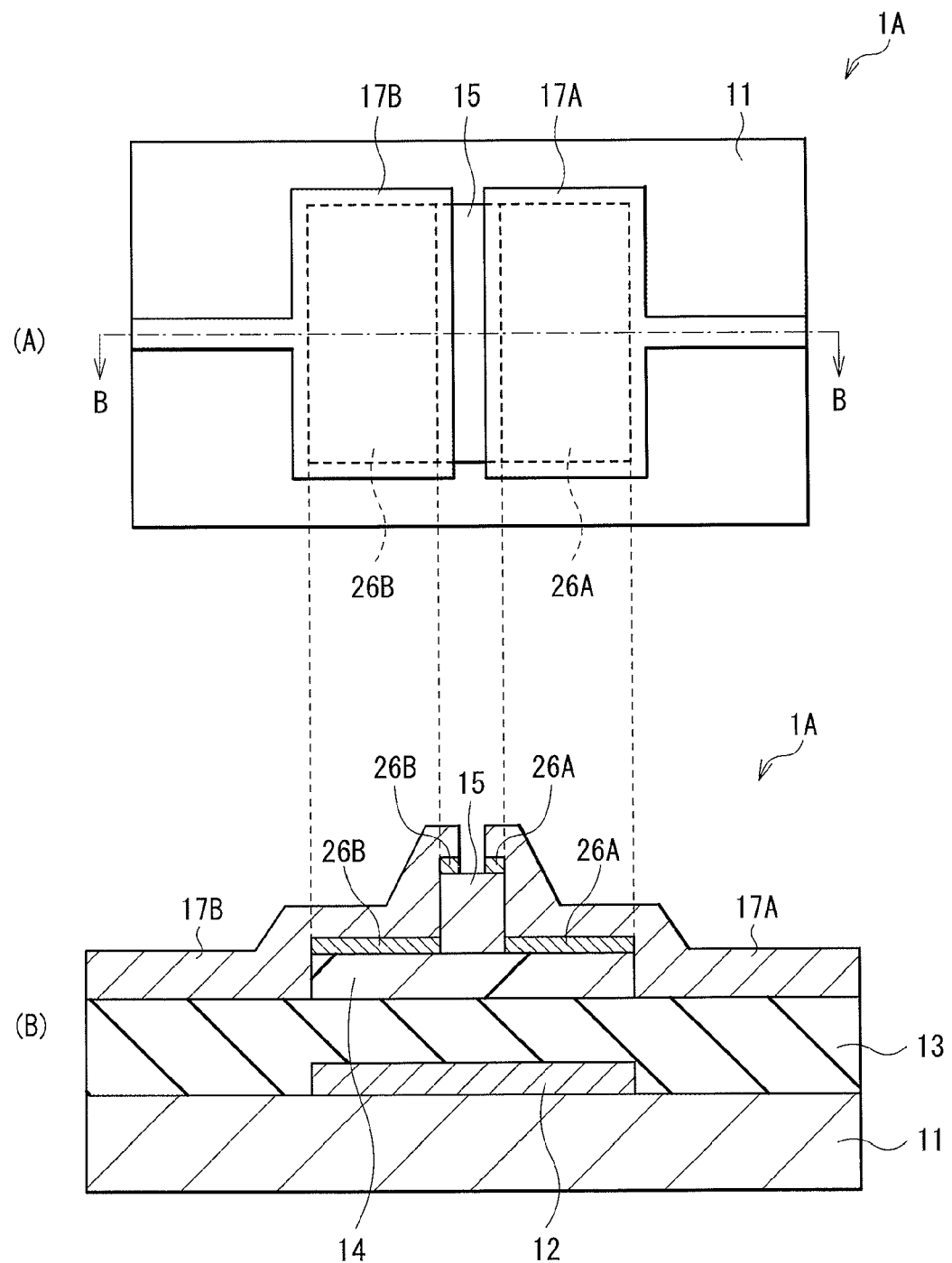
FIG. 7 illustrates a configuration of a transistor according to a modification.

Part (A) and Part (B) of FIG. 7 illustrate a plane configuration and a cross-sectional configuration, respectively, of a transistor (a transistor 1A) according to a modification of the embodiment described above. This transistor 1A is different from the transistor 1 of the above-described embodiment, in that contact layers 26A and 26B are disconnected by the etching stopper layer 15. Otherwise, the transistor 1A has a configuration, functions, and effects similar to those of the transistor 1. The same elements as those of the embodiment will be provided with the same reference numerals as those of the embodiment described above, and the description thereof will be omitted as appropriate.

In the transistor 1A, the contact layers 26A and 26B are divided into a part on the top surface of the etching stopper layer 15 and a part on the top surface of the organic semiconductor layer 14, and thus in a discontinuous state. Therefore, even when a solution such as an etching solution used in wet etching permeates the contact layers 26A and 26B on the etching stopper layer 15 in or after a process of forming the source-drain electrodes 17A and 17B, this solution or the like is allowed to be prevented from reaching the organic contact layers 26A and 26B on the organic semiconductor layer 14.

The transistor 1A may be manufactured as follows, for example.

Figure 8A:
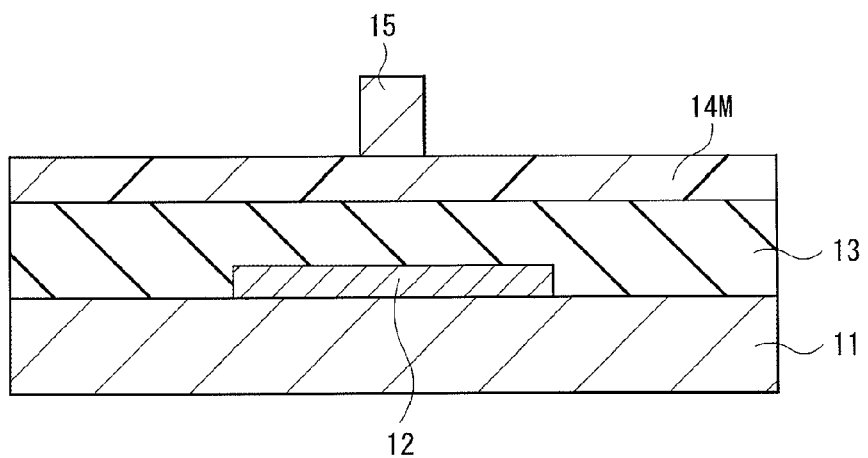
FIGS. 8A and 8B are cross-sectional diagrams illustrating a method of manufacturing the transistor illustrated in FIG. 7, in a process order.
Figure 8B:
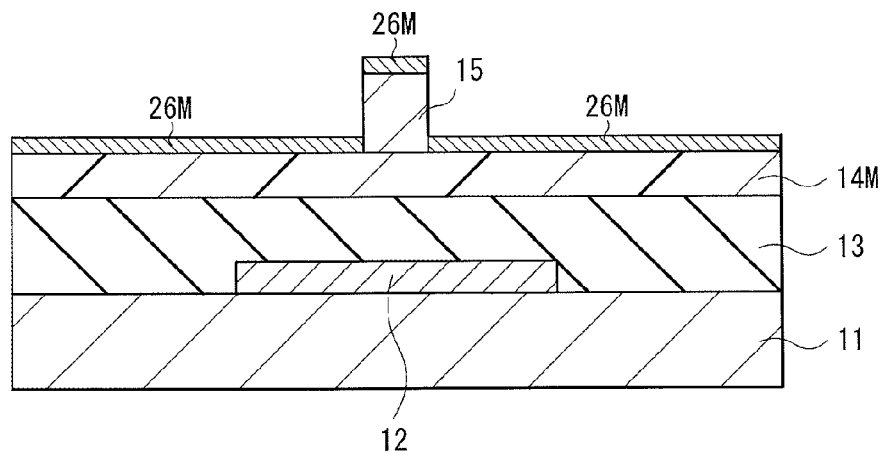

First, as illustrated in FIG. 8A, the processes up to the formation of the etching stopper layer 15 are performed in a manner similar to the transistor 1. Next, a contact material film 26M made of the material of the contact layers 26A and 26B is formed on the organic film 14M and the etching stopper layer 15, in which the contact material film 26M is divided by the etching stopper layer 15 (FIG. 8B). The contact material film 26M is divided (disconnected) by the etching stopper layer 15, through adjustment of the thickness of the contact material film 26M, the thickness of the etching stopper layer 15, and a taper angle. The contact material film 26M is acceptable as long as it is discontinuous between the top surface of the etching stopper layer 15 and the top surface of the organic semiconductor layer 14. For instance, the contact material film 26M may be present on end faces of the etching stopper layer 15 by being separated at corners of the etching stopper layer 15.

Figure 9A:
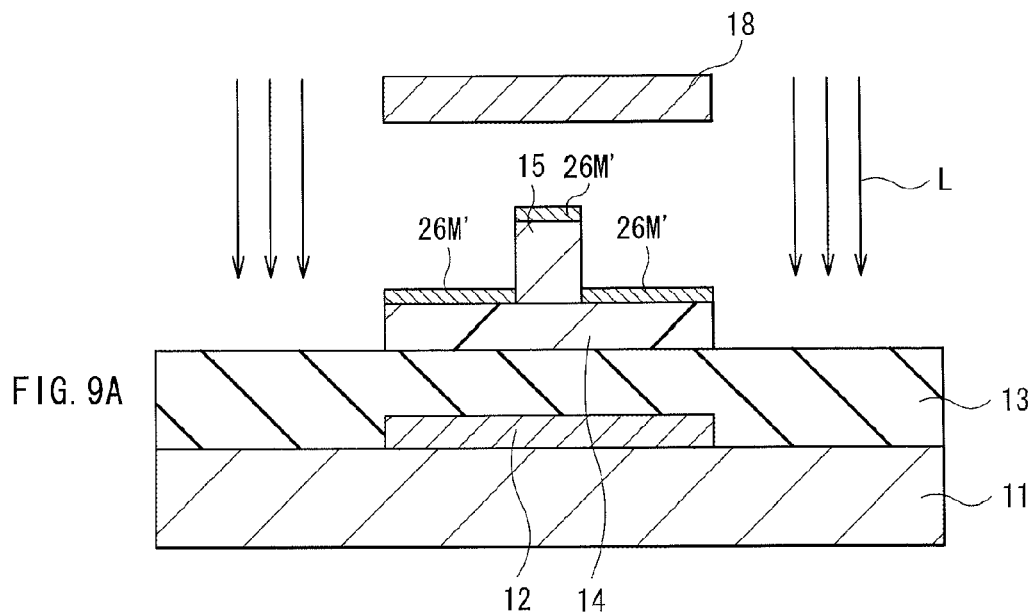
FIGS. 9A and 9B are cross-sectional diagrams illustrating processes following FIG. 8B.
Figure 9B:
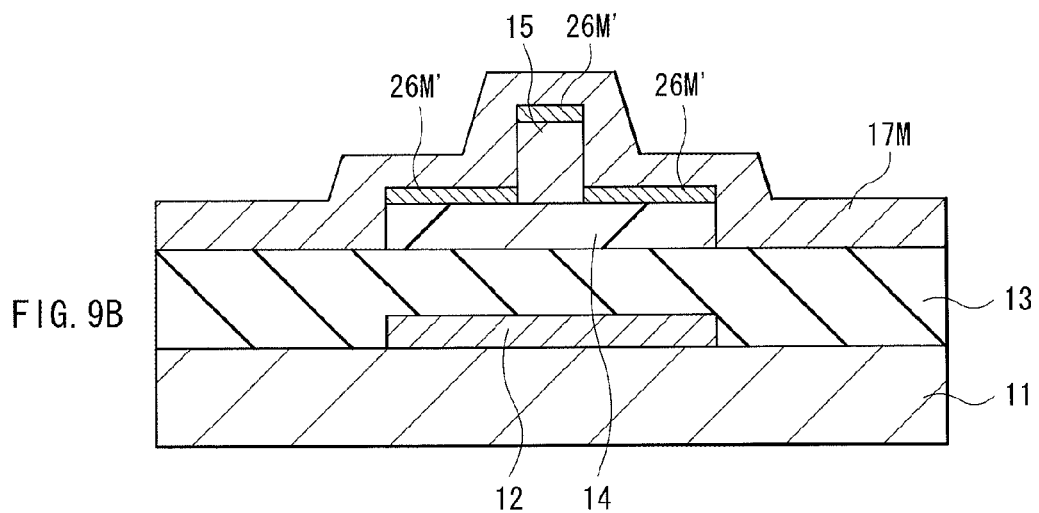

After the formation of the contact material film 26M, patterning of the organic film 14M and the contact material film 26M by laser ablation (FIG. 9A; a contact material film 26M'), and formation of the metal film 17M (FIG. 9B) are performed in this order, in a manner similar to the transistor 1.

After being formed, the metal film 17M is patterned to form the source-drain electrodes 17A and 17B. Here, the contact material film 26M' (the contact layers 26A and 26B) is disconnected by the etching stopper layer 15 and therefore, the contact material film 26M' on the organic semiconductor layer 14 is allowed to be prevented from deteriorating due to the etching solution, etc. Hence, formation of the source-drain electrodes 17A and 17B by wet etching is enabled. The metal film 17M may be patterned by dry etching in a manner similar to the transistor 1.

Simultaneously with the patterning of the metal film 17M or after the formation of the source-drain electrodes 17A and 17B, the contact layers 26A and 26B are formed by etching the contact material film 26M'. The transistor 1A is completed by the above-described processes.

[Application Example 1]

Figure 10:
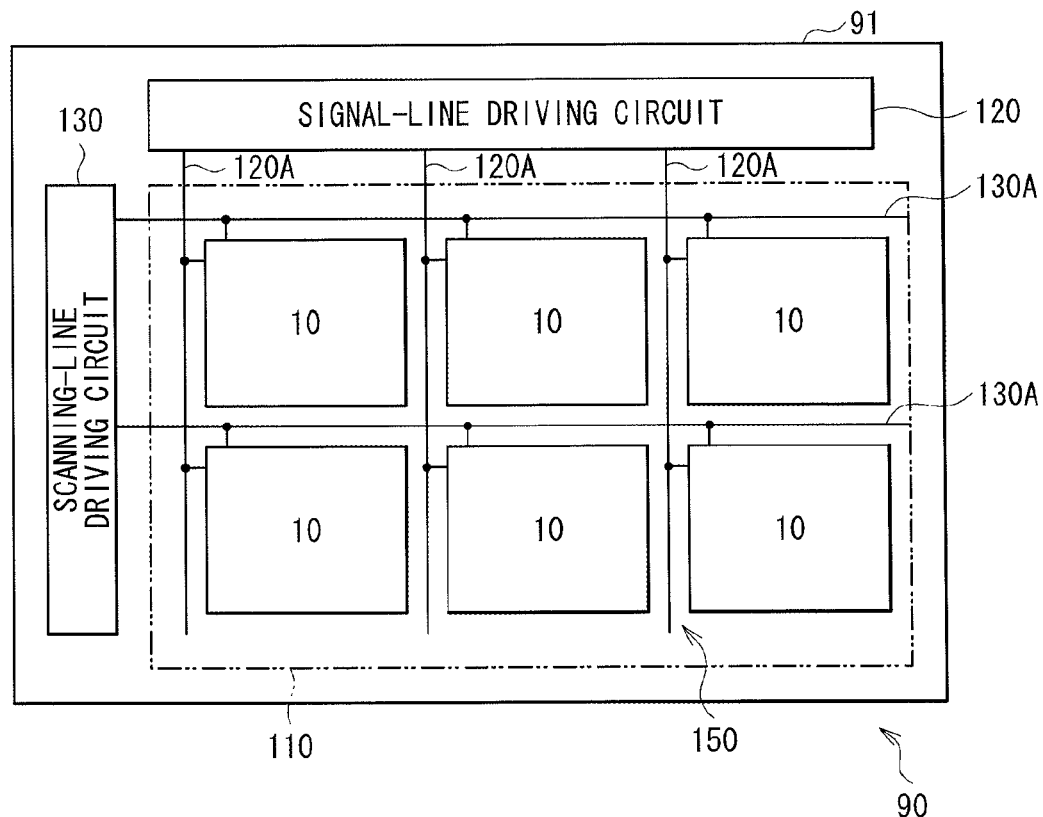
FIG. 10 is a diagram illustrating a circuit configuration of a display unit according to an application example 1.

FIG. 10 illustrates a circuit configuration of a display unit (a display unit 90) having either the transistor 1 or 1A as a drive device. The display unit 90 is, for example but not limited to, a liquid crystal display, an organic EL display, an electronic paper display, or the like. A plurality of pixels 10 disposed in a matrix and various drive circuits used to drive the pixels 10 are formed in a display region 110 on a drive panel 91. On the drive panel 91, for example, a signal-line driving circuit 120 as well as a scanning-line driving circuit 130 which are drivers for image display, and a pixel driving circuit 150 are disposed as the drive circuits. A sealing panel not illustrated is adhered to this drive panel 91, and the pixels 10 as well as the drive circuits are sealed by this sealing panel.

Figure 11:
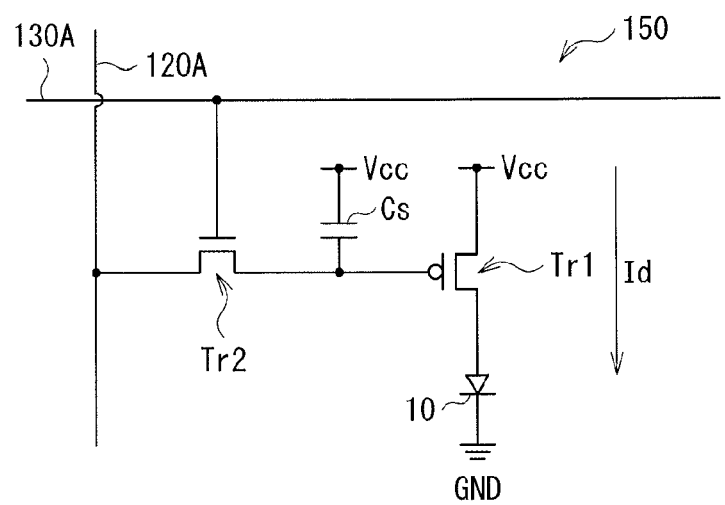
FIG. 11 is an equivalent circuit schematic illustrating an example of a pixel driving circuit illustrated in FIG. 10.

FIG. 11 is an equivalent circuit schematic of the pixel driving circuit 150. The pixel driving circuit 150 is an active-type drive circuit in which transistors Tr1 and Tr2 are each disposed as either the transistor 1 or 1A. A capacitor Cs is provided between the transistors Tr1 and Tr2, and the pixel 10 is connected to the transistor Tr1 in series between a first power supply line (Vcc) and a second power supply line (GND). In this pixel driving circuit 150, a plurality of signal lines 120A are arranged in a column direction, and a plurality of scanning lines 130A are arranged in a row direction. Each of the signal lines 120A is connected to the signal-line driving circuit 120, and an image signal is supplied from this signal-line driving circuit 120 to a source electrode of the transistor Tr2 through the signal line 120A. Each of the scanning lines 130A is connected to the scanning-line driving circuit 130, and a scanning signal is sequentially supplied from this scanning-line driving circuit 130 to a gate electrode of the transistor Tr2 through the scanning line 130A. In this display unit, the transistors Tr1 and Tr2 are each configured using either the transistor 1 or 1A of the embodiment described above. Therefore, high-quality display is allowed by the excellent TFT properties of the transistors Tr1 and Tr2. This display unit 90 may be, for example, incorporated into an electronic apparatus according to any of application examples 2 to 7 which will be described below.

[Application Example 2]

Figure 12A:
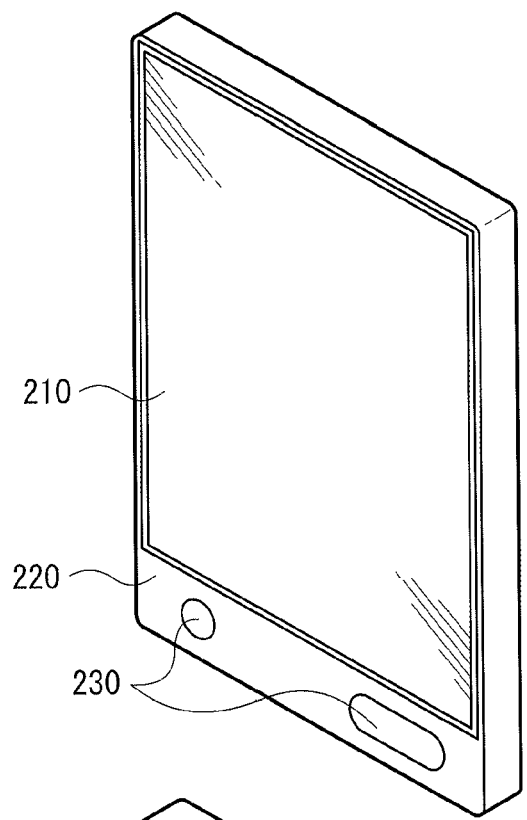
FIGS. 12A and 12B are perspective diagrams each illustrating an appearance of an application example 2.
Figure 12B:
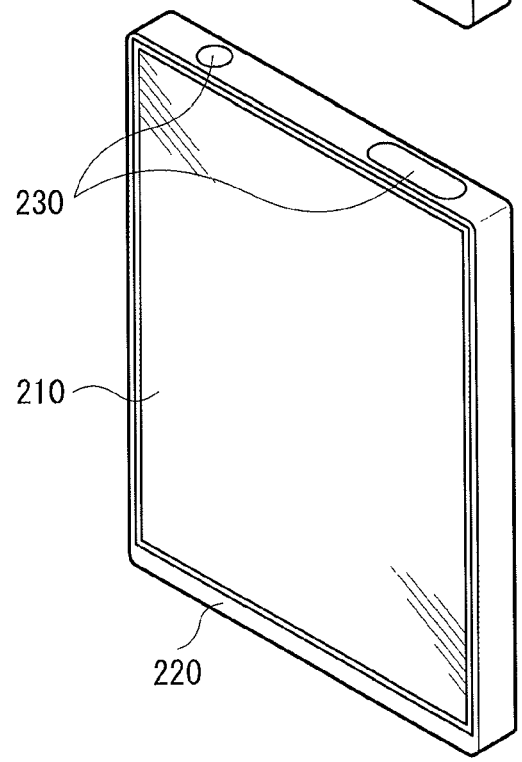

FIGS. 12A and 12B each illustrate an appearance of an electronic book. This electronic book includes, for example, a display section 210, a non-display section 220, and an operation section 230. The operation section 230 may be formed either on the same surface as a surface (a front surface) of the display section 210 as illustrated in FIG. 12A, or on a surface (a top surface) different from the surface of the display section 210 as illustrated in FIG. 12B.

[Application Example 3]

Figure 13:
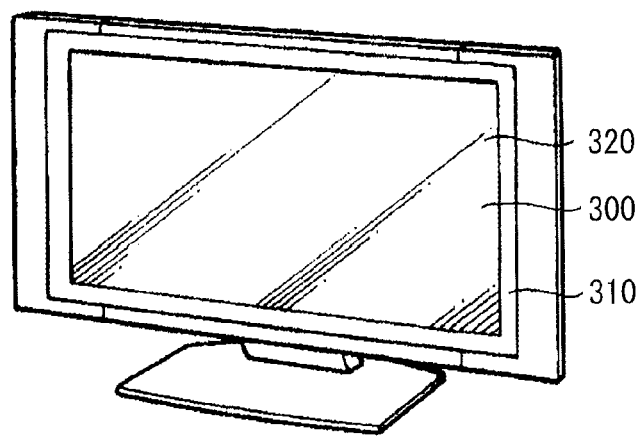
FIG. 13 is a perspective diagram illustrating an appearance of an application example 3.

FIG. 13 illustrates an appearance of a television receiver. This television receiver has, for example, an image-display screen section 300 that includes a front panel 310 and a filter glass 320.

[Application Example 4]

Figure 14A:
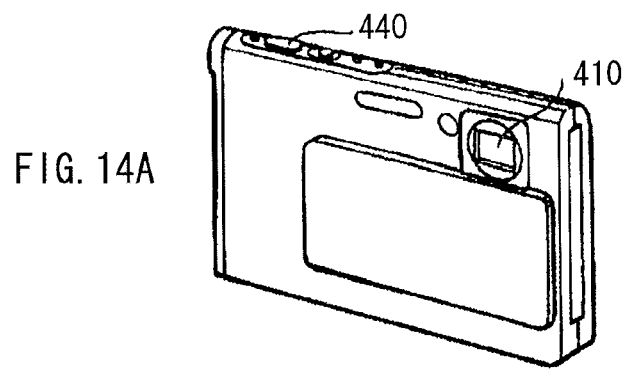
FIGS. 14A and 14B are perspective diagrams each illustrating an appearance of an application example 4, namely.
Figure 14B:
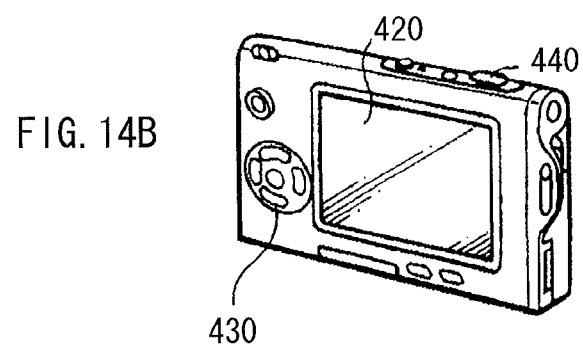

FIGS. 14A and 14B each illustrate an appearance of a digital camera. This digital camera includes, for example, a flash emitting section 410, a display section 420, a menu switch 430, and a shutter release 440.

[Application Example 5]

Figure 15:
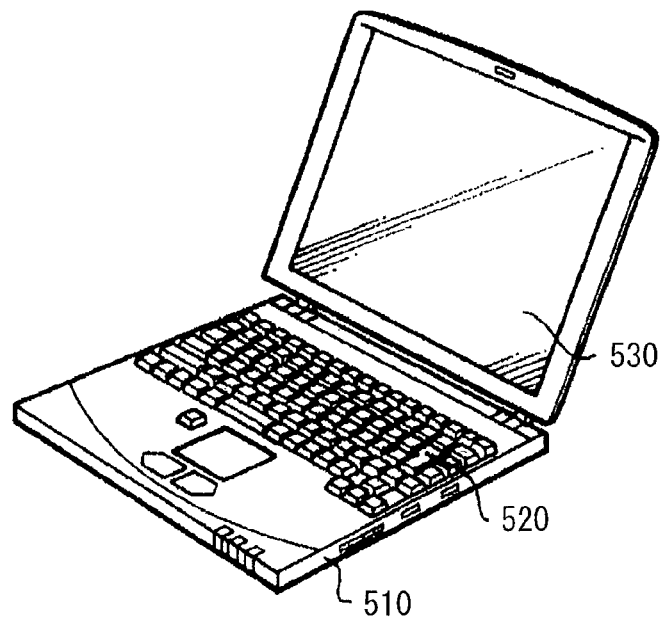
FIG. 15 is a perspective diagram illustrating an appearance of an application example 5.

FIG. 15 illustrates an appearance of a laptop computer. This laptop computer includes, for example, a main body section 510, a keyboard 520 provided to enter characters and the like, and a display section 530 displaying an image.

[Application Example 6]

Figure 16:
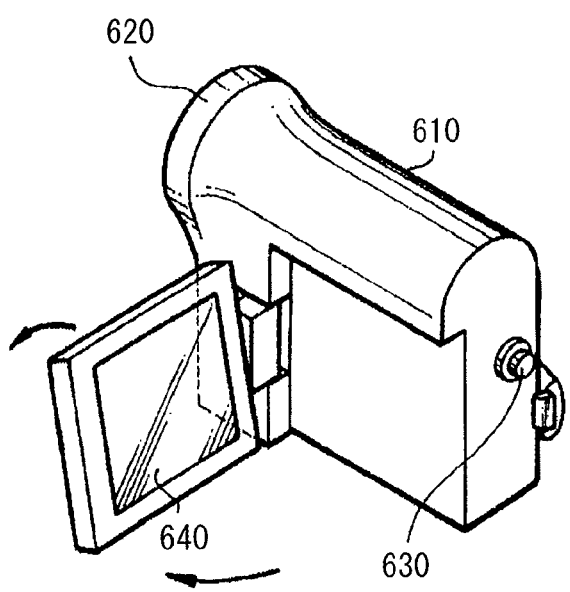
FIG. 16 is a perspective diagram illustrating an appearance of an application example 6.

FIG. 16 illustrates an appearance of a video camera. This video camera includes, for example, a main body section 610, a lens 620 disposed on a front face of this main body section 610 to shoot an image of a subject, a start/stop switch 630 used in shooting, and a display section 640.

[Application Example 7]

FIGS. 17A to 17G each illustrate an appearance of a portable telephone. This portable telephone is, for example, a unit in which an upper housing 710 and a lower housing 720 are connected by a coupling section (a hinge section) 730, and includes a display 740, a sub-display 750, a picture light 760, and a camera 770.

The technology has been described with reference to the example embodiment, the example modification, and the application examples, but is not limited thereto, and may be variously modified. For example, in the embodiment and the like described above, the transistors 1 and 1A of the top-contact bottom-gate type have been described, but a transistor having a top-contact top-gate structure may be used.

Further, in the embodiment and the like described above, the contact layer 16A, the end faces of the organic semiconductor layer 14 agree in position with the end faces of the contact layers 16A and 16B (26A and 26B). However, it is not necessary for the end faces of the contact layers 16A and 16B to agree in position with those of the organic semiconductor layer 14, as long as the contact layers 16A and 16B are on the organic semiconductor layer 14.

Furthermore, in the embodiment and the like described above, the semiconductor layer is configured using the organic semiconductor material. However, the semiconductor layer may be configured using an inorganic material such as silicon and an oxide semiconductor.

In addition, for example, the material and thickness of each layer, or the film formation methods and film formation conditions described in the embodiment described above are not limited. Alternatively, other materials and thicknesses, or other film formation methods and film formation conditions may be adopted.

Accordingly, it is possible to achieve at least the following configurations from the above-described example embodiment, the modifications, and the application examples of the disclosure.

(1) A transistor, including:
   a gate electrode;
   a semiconductor layer facing the gate electrode, with an insulating layer interposed in between;
   an etching stopper layer on the semiconductor layer;
   a pair of contact layers provided on the semiconductor layer, at least on both sides of the etching stopper layer; and
   source-drain electrodes electrically connected to the semiconductor layer through the pair of contact layers, and being in contact with the insulating layer.

(2) The transistor according to (1), wherein
   the pair of contact layers have respective surfaces facing each other, and respective end faces opposite to the respective surfaces, and
   the source-drain electrodes cover the end faces of the respective contact layers.

(3) The transistor according to (1) or (2), wherein the end faces of the respective contact layers agree in position with end faces of the semiconductor layer.

(4) The transistor according to any one of (1) to (3), wherein the pair of contact layers are provided also on a top surface of the etching stopper layer.

(5) The transistor according to (4), wherein each of the contact layers is divided into a part on the top surface of the etching stopper layer and a part on the organic semiconductor layer.

(6) The transistor according to any one of (1) to (5), wherein the pair of contact layers are also provided on a top surface and end faces of the etching stopper layer.

(7) The transistor according to (6), wherein the pair of contact layers are provided on the semiconductor layer, continuously from the top surface of the etching stopper layer through the end faces of the etching stopper layer.

(8) The transistor according to any one of (1) to (7), wherein the insulating layer has a connection aperture that makes a connection between the source-drain electrodes and an electrode provided below the insulating layer.
(9) The transistor according to any one of (1) to (8), wherein the semiconductor layer includes an organic semiconductor material.
(10) A method of manufacturing a transistor, the method including:
forming a gate electrode;
forming a semiconductor layer that faces the gate electrode, with an insulating layer interposed in between;
forming an etching stopper layer on the semiconductor layer;
forming a pair of contact layers on the semiconductor layer, at least on both sides of the etching stopper layer; and
forming source-drain electrodes in a region from the pair of contact layers to the insulating layer on the pair of contact layers and on the insulating layer.
(11) The method of manufacturing the transistor according to (10), wherein the semiconductor layer and the contact layers are formed together by patterning.
(12) The method of manufacturing the transistor according to (11), wherein the patterning is performed by laser ablation.
(13) A display unit with pixels and at least one transistor that drives the pixels, the at least one transistor including:
a gate electrode;
a semiconductor layer facing the gate electrode, with an insulating layer interposed in between;
an etching stopper layer on the semiconductor layer;
a pair of contact layers provided on the semiconductor layer, at least on both sides of the etching stopper layer; and
source-drain electrodes electrically connected to the semiconductor layer through the pair of contact layers, and being in contact with the insulating layer.
(14) An electronic apparatus with a display unit, the display unit being provided with pixels and at least one transistor that drives the pixels, the at least one transistor including:
a gate electrode;
a semiconductor layer facing the gate electrode, with an insulating layer interposed in between;
an etching stopper layer on the semiconductor layer;
a pair of contact layers provided on the semiconductor layer, at least on both sides of the etching stopper layer; and
source-drain electrodes electrically connected to the semiconductor layer through the pair of contact layers, and being in contact with the insulating layer.

It should be understood by those skilled in the art that various modifications, combinations, sub-combinations and alterations may occur depending on design requirements and other factors insofar as they are within the scope of the appended claims or the equivalents thereof.

What is claimed is:
1. A transistor, comprising:
a gate electrode;
a semiconductor layer facing the gate electrode, with an insulating layer interposed in between, wherein the semiconductor layer includes an organic semiconductor material;
an etching stopper layer on the semiconductor layer;
a pair of contact layers provided on the semiconductor layer, at least on both sides of the etching stopper layer; and
source-drain electrodes electrically connected to the semiconductor layer through the pair of contact layers, and being in contact with the insulating layer, wherein the pair of contact layers have respective surfaces facing each other, and respective end faces opposite to the respective surfaces, and
the source-drain electrodes cover the end faces of the respective contact layers, so that the end faces of the respective contact layers are protected.
2. The transistor according to claim 1, wherein the end faces of the respective contact layers agree in position with end faces of the semiconductor layer.
3. The transistor according to claim 1, wherein the pair of contact layers are provided also on a top surface of the etching stopper layer.
4. The transistor according to claim 3, wherein each of the contact layers is divided into a part on the top surface of the etching stopper layer and a part on the semiconductor layer.
5. The transistor according to claim 1, wherein the pair of contact layers are also provided on a top surface and end faces of the etching stopper layer.
6. The transistor according to claim 5, wherein the pair of contact layers are provided on the semiconductor layer, continuously from the top surface of the etching stopper layer through the end faces of the etching stopper layer.
7. The transistor according to claim 1, wherein the insulating layer has a connection aperture that makes a connection between the source-drain electrodes and an electrode provided below the insulating layer.
8. A method of manufacturing a transistor, the method comprising:
forming a gate electrode;
forming a semiconductor layer that faces the gate electrode, with an insulating layer interposed in between, wherein the semiconductor layer includes an organic semiconductor material;
forming an etching stopper layer on the semiconductor layer;
forming a pair of contact layers on the semiconductor layer, at least on both sides of the etching stopper layer, wherein the pair of contact layers is formed to have respective surfaces facing each other, and respective end faces opposite to the respective surfaces; and
forming source-drain electrodes in a region from the pair of contact layers to the insulating layer on the pair of contact layers and on the insulating layer, wherein the source-drain electrodes are formed to cover the end faces of the respective contact layers, so that the end faces of the respective contact layers are protected.
9. The method of manufacturing the transistor according to claim 8, wherein the semiconductor layer and the contact layers are patterned together.
10. The method of manufacturing the transistor according to claim 9, wherein the patterning is performed by laser ablation.
11. A display unit with pixels and at least one transistor that drives the pixels, the at least one transistor comprising:
a gate electrode;
a semiconductor layer facing the gate electrode, with an insulating layer interposed in between, wherein the semiconductor layer includes an organic semiconductor material;
an etching stopper layer on the semiconductor layer;
a pair of contact layers provided on the semiconductor layer, at least on both sides of the etching stopper layer; and
source-drain electrodes electrically connected to the semiconductor layer through the pair of contact layers, and being in contact with the insulating layer, wherein the pair of contact layers have respective surfaces facing each other, and respective end faces opposite to the respective surfaces, and the source-drain electrodes cover the end faces of the respective contact layers, so that the end faces of the respective contact layers are protected.

12. An electronic apparatus with a display unit, the display unit being provided with pixels and at least one transistor that drives the pixels, the at least one transistor comprising:

a gate electrode;

a semiconductor layer facing the gate electrode, with an insulating layer interposed in between, wherein the semiconductor layer includes an organic semiconductor material;

an etching stopper layer on the semiconductor layer;

a pair of contact layers provided on the semiconductor layer, at least on both sides of the etching stopper layer; and source-drain electrodes electrically connected to the semiconductor layer through the pair of contact layers, and being in contact with the insulating layer, wherein the pair of contact layers have respective surfaces facing each other, and respective end faces opposite to the respective surfaces, and the source-drain electrodes cover the end faces of the respective contact layers, so that the end faces of the respective contact layers are protected.

* * * * *